(12) United States Patent
Fang et al.

(10) Patent No.: US 11,355,519 B2
(45) Date of Patent: Jun. 7, 2022

(54) ARRAY SUBSTRATE, MANUFACTURING METHOD THEREOF, AND DISPLAY DEVICE

(71) Applicant: SHENZHEN CHINA STAR OPTOELECTRONICS SEMICONDUCTOR DISPLAY TECHNOLOGY CO., LTD., Shenzhen (CN)

(72) Inventors: Chunhsiung Fang, Shenzhen (CN); Yuanchun Wu, Shenzhen (CN); Poyen Lu, Shenzhen (CN)

( * ) Notice: Subject to any disclaimer, the term of this patent is extended or adjusted under 35 U.S.C. 154(b) by 276 days.

(21) Appl. No.: 16/616,980

(22) PCT Filed: Aug. 23, 2019

(86) PCT No.: PCT/CN2019/102163
§ 371 (c)(1),
(2) Date: Nov. 26, 2019

(87) PCT Pub. No.: WO2020/224095
PCT Pub. Date: Nov. 12, 2020

(65) Prior Publication Data
US 2021/0358970 A1 Nov. 18, 2021

(30) Foreign Application Priority Data

May 5, 2019 (CN) .......................... 201910368677.3

(51) Int. Cl.
*H01L 27/00* (2006.01)
*H01L 29/00* (2006.01)
(Continued)

(52) U.S. Cl.
CPC ........ *H01L 27/1225* (2013.01); *H01L 27/127* (2013.01); *H01L 27/1251* (2013.01);
(Continued)

(58) Field of Classification Search
CPC ............. H01L 27/1225; H01L 27/1251; H01L 27/1255; H01L 27/127; H01L 27/3262;
(Continued)

(56) References Cited

U.S. PATENT DOCUMENTS

2017/0084636 A1 3/2017 Lin et al.
2017/0084639 A1 3/2017 Kao et al.
(Continued)

FOREIGN PATENT DOCUMENTS

CN 106558592 A 4/2017
CN 106876412 A 6/2017
(Continued)

*Primary Examiner* — Nikolay K Yushin

(57) ABSTRACT

The present disclosure provides an array substrate, a manufacturing method of the array substrate, and a display device. The array substrate includes a hydrogen ion film formed between an active layer and a source/drain electrode of a low temperature poly-silicon thin film transistor, and a hole is formed in a region of the hydrogen ion film where a metal-oxide-semiconductor thin film transistor is disposed. Based on the hydrogen ion film, the electrical performance and stability of the low temperature poly-silicon thin film transistor are improved. Furthermore, hydrogen elements are not diffused to the region where the metal-oxide-semiconductor thin film transistor is disposed.

16 Claims, 10 Drawing Sheets

(51) Int. Cl.
*H01L 27/12* (2006.01)
*H01L 29/40* (2006.01)
*H01L 29/49* (2006.01)
*H01L 29/66* (2006.01)
*H01L 29/786* (2006.01)
*G02F 1/1368* (2006.01)
*H01L 27/32* (2006.01)

(52) U.S. Cl.
CPC ........ *H01L 27/1255* (2013.01); *H01L 29/401* (2013.01); *H01L 29/4908* (2013.01); *H01L 29/66757* (2013.01); *H01L 29/66969* (2013.01); *H01L 29/7869* (2013.01); *H01L 29/78675* (2013.01); *G02F 1/1368* (2013.01); *G02F 2202/104* (2013.01); *H01L 27/3262* (2013.01)

(58) Field of Classification Search
CPC ............... H01L 29/401; H01L 29/4908; H01L 29/66757; H01L 29/66969; H01L 29/78675; H01L 29/7869; H01L 27/1248; G02F 1/1368; G02F 1/1301; G02F 1/136286; G02F 1/13454; G02F 1/13685; G02F 2202/104; G02F 2202/103; G02F 2202/36; G02F 2202/40; G02F 1/1333; G02F 1/133555

See application file for complete search history.

(56) References Cited

U.S. PATENT DOCUMENTS

| | | | |
|---|---|---|---|
| 2017/0084641 | A1 | 3/2017 | Lin et al. |
| 2017/0084642 | A1 | 3/2017 | Lin et al. |
| 2017/0358610 | A1 | 12/2017 | Hanyu et al. |
| 2018/0006065 | A1 | 1/2018 | Lin et al. |
| 2018/0331128 | A1 | 11/2018 | Hanyu et al. |
| 2019/0103420 | A1 | 4/2019 | Liu et al. |
| 2019/0109160 | A1 | 4/2019 | Lin et al. |
| 2019/0252418 | A1 | 8/2019 | Kao et al. |
| 2020/0295056 | A1 | 9/2020 | Hideo |

FOREIGN PATENT DOCUMENTS

| | | |
|---|---|---|
| CN | 107026178 A | 8/2017 |
| CN | 107507835 A | 12/2017 |
| CN | 107818989 A | 3/2018 |
| CN | 109326611 A | 2/2019 |

ARRAY SUBSTRATE, MANUFACTURING METHOD THEREOF, AND DISPLAY DEVICE

BACKGROUND

Field

The present disclosure relates to the technical field of display techniques, and more particularly to an array substrate, a manufacturing method thereof, and a display device.

Background

Low temperature poly-silicon (LTPS) thin film transistors (TFTs) and metal-oxide-semiconductor (MOS) TFTs are two different types of TFTs and each has its advantages. For example, the LTPS TFTs have high carrier mobilities and high stability and are suitable for driving circuits of display devices. The MOS FETs have better electrical uniformity and low switch leakage currents and suitable for pixel circuits of display devices.

However, since the two types of TFTs have different requirements for operating environments (e.g., whether hydrogen ions are required), the two types of TFTs cannot be operated in the same operating environment. For example, the two types of TFTs cannot be stably operated in the same display panel.

Consequently, the technical problem that different types of TFTs cannot be stably operated for a long time in the same display panel exists in the prior art and needs to be solved.

SUMMARY OF THE DISCLOSURE

The present disclosure provides an array substrate, a manufacturing method thereof, and a display device to relieve the problem that different types of thin film transistors cannot be stably operated for a long time in the same display panel in the prior art.

To solve the above problem, the present disclosure provides technical schemes as follows.

An embodiment of the present disclosure provides an array substrate including: a substrate; a low temperature poly-silicon thin film transistor and a metal-oxide-semiconductor thin film transistor formed on the substrate; and a hydrogen ion film formed between an active layer and a source/drain electrode of the low temperature poly-silicon thin film transistor, wherein a hole is formed in a region of the hydrogen ion film where the metal-oxide-semiconductor thin film transistor is disposed.

In the embodiment of the present disclosure, the array substrate includes a first insulating layer located between the active layer and a gate electrode of the low temperature poly-silicon thin film transistor, the first insulating layer includes a first silicon oxide layer and a first silicon nitride layer, and the first silicon nitride layer is patterned to form a first hydrogen ion film of the hydrogen ion film.

In the embodiment of the present disclosure, the array substrate includes a second insulating layer located between the gate electrode and the source/drain electrode of the low temperature poly-silicon thin film transistor, the second insulating layer includes a second silicon oxide layer and a second silicon nitride layer, and the second silicon nitride layer is patterned to form a second hydrogen ion film of the hydrogen ion film.

In the embodiment of the present disclosure, the second silicon oxide layer is disposed between a gate electrode and an active layer of the metal-oxide-semiconductor thin film transistor.

In the embodiment of the present disclosure, wherein the array substrate includes a buffer layer formed on the substrate and a third insulating layer located between the gate electrode of the low temperature poly-silicon thin film transistor and the second insulating layer; and the first silicon oxide layer and the third insulating layer are stacked and disposed between the buffer layer and the gate electrode of the metal-oxide-semiconductor thin film transistor.

In the embodiment of the present disclosure, the active layer of the low temperature poly-silicon thin film transistor is disposed on the buffer layer.

In the embodiment of the present disclosure, a material of the buffer layer is silicon oxide.

In the embodiment of the present disclosure, the array substrate further includes a storage capacitor; and a first electrode plate of the storage capacitor and the gate electrode of the low temperature poly-silicon thin film transistor are disposed in the same layer, and a second electrode plate of the storage capacitor and the gate electrode of the metal-oxide-semiconductor thin film transistor are disposed in the same layer.

In the embodiment of the present disclosure, the array substrate further includes a protection layer; and the first silicon oxide layer and the first silicon nitride layer are disposed between the buffer layer and the first electrode plate of the storage capacitor, the third insulating layer is disposed between the first electrode plate and the second electrode plate of the storage capacitor, and the second silicon oxide layer and the second silicon nitride layer are disposed between the second electrode plate of the storage capacitor and the protection layer.

An embodiment of the present disclosure provides a manufacturing method of an array substrate, including: providing a substrate; and manufacturing thin film transistors and a hydrogen ion film; wherein the thin film transistors include a low temperature poly-silicon thin film transistor and a metal-oxide-semiconductor thin film transistor formed on the substrate, the hydrogen ion film is formed between an active layer and a source/drain electrode of the low temperature poly-silicon thin film transistor, and a hole is formed in a region of the hydrogen ion film where the metal-oxide-semiconductor thin film transistor is disposed.

An embodiment of the present disclosure provides a display device including a display panel. An array substrate of the display panel includes: a substrate; a low temperature poly-silicon thin film transistor and a metal-oxide-semiconductor thin film transistor formed on the substrate; and a hydrogen ion film formed between an active layer and a source/drain electrode of the low temperature poly-silicon thin film transistor, wherein a hole is formed in a region of the hydrogen ion film where the metal-oxide-semiconductor thin film transistor is disposed.

In the embodiment of the present disclosure, the array substrate includes a first insulating layer located between the active layer and a gate electrode of the low temperature poly-silicon thin film transistor, the first insulating layer includes a first silicon oxide layer and a first silicon nitride layer, and the first silicon nitride layer is patterned to form a first hydrogen ion film of the hydrogen ion film.

In the embodiment of the present disclosure, the array substrate includes a second insulating layer located between the gate electrode and the source/drain electrode of the low temperature poly-silicon thin film transistor, the second insulating layer includes a second silicon oxide layer and a second silicon nitride layer, and the second silicon nitride layer is patterned to form a second hydrogen ion film of the hydrogen ion film.

In the embodiment of the present disclosure, the second silicon oxide layer is disposed between a gate electrode and an active layer of the metal-oxide-semiconductor thin film transistor.

In the embodiment of the present disclosure, the array substrate includes a buffer layer formed on the substrate and a third insulating layer located between the gate electrode of the low temperature poly-silicon thin film transistor and the second insulating layer; and the first silicon oxide layer and the third insulating layer are stacked and disposed between the buffer layer and the gate electrode of the metal-oxide-semiconductor thin film transistor.

In the embodiment of the present disclosure, the active layer of the low temperature poly-silicon thin film transistor is disposed on the buffer layer.

In the embodiment of the present disclosure, a material of the buffer layer is silicon oxide.

In the embodiment of the present disclosure, the array substrate further includes a storage capacitor; and a first electrode plate of the storage capacitor and the gate electrode of the low temperature poly-silicon thin film transistor are disposed in the same layer, and a second electrode plate of the storage capacitor and the gate electrode of the metal-oxide-semiconductor thin film transistor are disposed in the same layer.

In the embodiment of the present disclosure, the array substrate further includes a protection layer; and the first silicon oxide layer and the first silicon nitride layer are disposed between the buffer layer and the first electrode plate of the storage capacitor, the third insulating layer is disposed between the first electrode plate and the second electrode plate of the storage capacitor, and the second silicon oxide layer and the second silicon nitride layer are disposed between the second electrode plate of the storage capacitor and the protection layer.

In the embodiment of the present disclosure, the display panel is a liquid crystal display panel or an organic light emitting diode display panel.

Beneficial effect of the present disclosure is described as follows. The present disclosure provides the array substrate, the manufacturing method of the array substrate, and the display device. The array substrate includes the low temperature poly-silicon thin film transistor and the metal-oxide-semiconductor thin film transistor formed on the substrate and the hydrogen ion film. The hydrogen ion film is formed between the active layer and the source/drain electrode of the low temperature poly-silicon thin film transistor, and the hole is formed in the region of the hydrogen ion film where the metal-oxide-semiconductor thin film transistor is disposed. Hydrogen elements generated based on the hydrogen ion film are bonded with silicon atoms, thereby repairing the above-mentioned defects inside the poly-silicon thin film and improving the electrical performance and stability of the low temperature poly-silicon thin film transistor. Furthermore, the hydrogen elements are not diffused to the region where the metal-oxide-semiconductor thin film transistor is disposed. The oxygen vacancies are not generated from the metal oxides of the metal-oxide-semiconductor thin film transistor, and the electrical characteristics and stability of the metal-oxide-semiconductor thin film transistor are not affected. The problem that different types of thin film transistors cannot be stably operated for a long time in the same display panel in the prior art can be relieved.

BRIEF DESCRIPTION OF THE DRAWINGS

In order to more clearly illustrate the embodiments or the technical schemes in the prior art, the following drawings of the embodiments or in the prior art will be briefly introduced. It is obvious that the drawings are merely some embodiments of the present disclosure, those skilled in the art may derive other drawings according the drawings described below without creative endeavor.

DETAILED DESCRIPTION OF THE PREFERRED EMBODIMENTS

Figure 1:
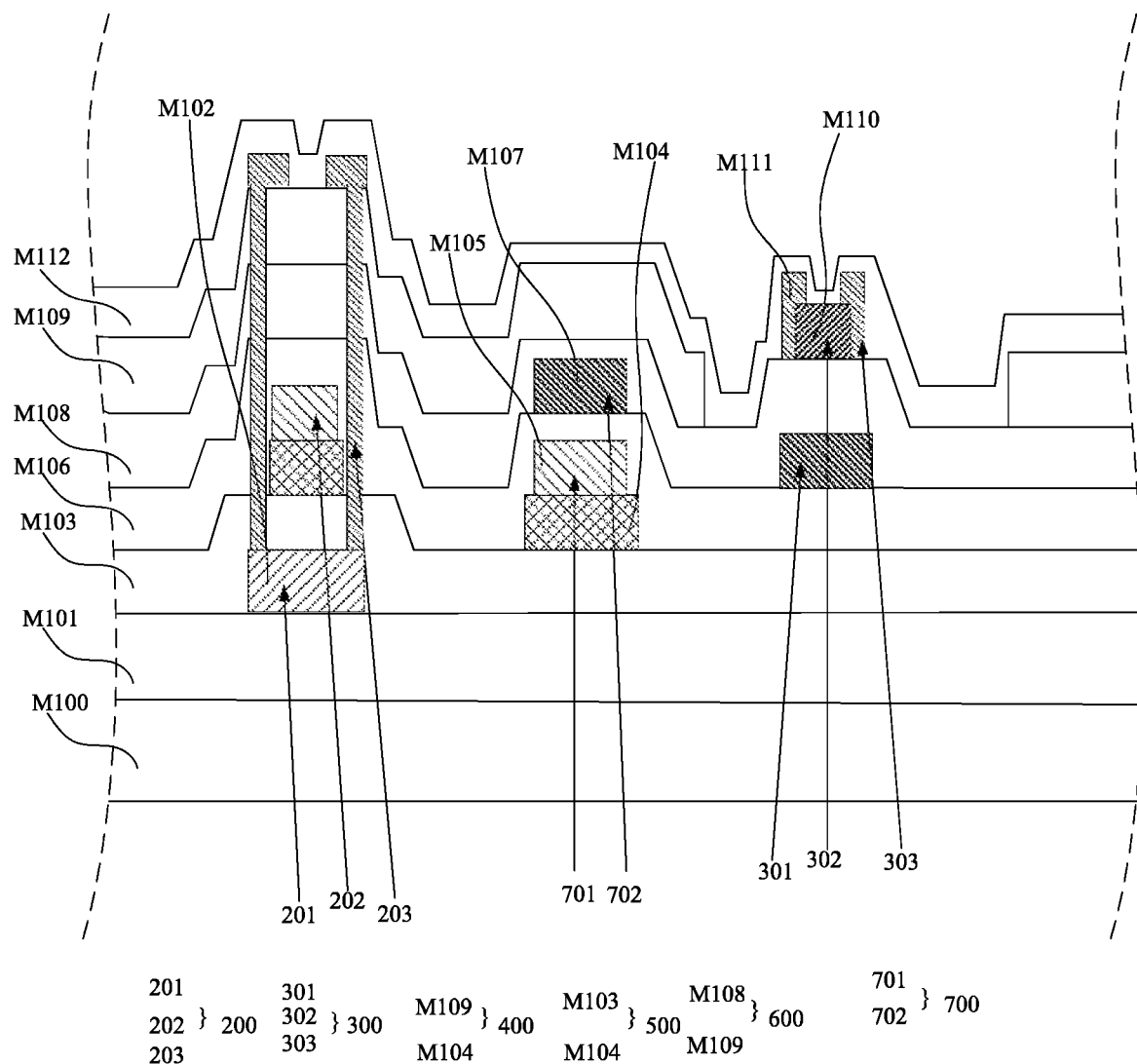
FIG. 1 illustrates a structure diagram of an array substrate provided by an embodiment of the present disclosure.

Hereinafter, exemplary embodiments of the present disclosure will be described with reference to the accompanying drawings for illustrating specific embodiments which can be carried out by the present disclosure. The directional terms described in the present disclosure, such as upper, lower, front, rear, left, right, inner, outer, side, etc., are only directions with reference to the accompanying drawings, so that the used directional terms are used to describe and understand the present disclosure, but the present disclosure is not limited thereto. In the drawings, units with similar structures use the same numerals.

In the drawings, in order to clearly show devices, layers and regions are enlarged. The same numerals represent the same devices in the specification and drawings.

Embodiments of the present disclosure can relieve the technical problem in the prior art that different types of TFTs cannot be stably operated for a long time in the same display panel.

In one embodiment, as shown in FIG. 1, an array substrate 10 provided by the present disclosure includes:

A substrate M100;

A low temperature poly-silicon (LTPS) thin film transistor (TFT) 200 and a metal-oxide-semiconductor (MOS) thin film transistor 300 formed on the substrate M100; and A hydrogen ion film 400 formed between an active layer 201 and a source/drain electrode 203 of the low temperature poly-silicon thin film transistor 200, wherein a hole is formed in a region of the hydrogen ion film 400 where the metal-oxide-semiconductor thin film transistor 300 is disposed.

In the process of manufacturing the low temperature poly-silicon thin film transistor 200, polysilicon is not perfect crystal. There are many defects inside a poly-silicon thin film, such as silicon vacancies, grain boundaries, and dislocations. These defects affect the electrical performance and stability of the thin film transistor seriously. To reduce the defects, the hydrogen ion film 400 (e.g., a SiNx-H film) including numerous hydrogen elements is deposited above and below the poly-silicon thin film in the embodiment of the present disclosure. In the following high temperature process, the hydrogen elements can be diffused to the poly-silicon thin film and bonded with silicon atoms, thereby repairing the above-mentioned defects inside the poly-silicon thin film and improving the electrical performance and stability of the low temperature poly-silicon thin film transistor 200.

However, the hydrogen atoms also are diffused to a metal-oxide-semiconductor thin film (e.g., indium gallium zinc oxide (IGZO)) of the metal-oxide-semiconductor thin film transistor 300. Metal oxide reduction occurs, and oxygen vacancies are generated. The oxygen vacancies affect the electrical conductivity of the metal-oxide-semiconductor thin film transistor 300, so that the electrical characteristics of metal oxides are shifted. To solve this problem, the hole is formed in the region of the hydrogen ion film 400 where the metal-oxide-semiconductor thin film transistor 300 is disposed in the embodiment of the present disclosure. The hydrogen ion film 400 (e.g., silicon nitride) is not disposed around the metal-oxide-semiconductor thin film transistor 300. As such, the electrical characteristics of the metal-oxide-semiconductor thin film transistor 300 are not changed because an active layer of the metal-oxide-semiconductor thin film transistor 300 can be ensured that is not affected by the hydrogen atoms.

The present embodiment provides the array substrate 10. The array substrate 10 includes the low temperature poly-silicon thin film transistor 200 and the metal-oxide-semiconductor thin film transistor formed on the substrate M100 and the hydrogen ion film 400. The hydrogen ion film 400 is formed between the active layer 201 and the source/drain electrode 203 of the low temperature poly-silicon thin film transistor 200, and the hole is formed in the region of the hydrogen ion film 400 where the metal-oxide-semiconductor thin film transistor 300 is disposed. The hydrogen elements generated based on the hydrogen ion film 400 are bonded with the silicon atoms, thereby repairing the above-mentioned defects inside the poly-silicon thin film and improving the electrical performance and stability of the low temperature poly-silicon thin film transistor 200. Furthermore, the hydrogen elements are not diffused to the region where the metal-oxide-semiconductor thin film transistor 300 is disposed. The oxygen vacancies are not generated from the metal oxides of the metal-oxide-semiconductor thin film transistor 300, and the electrical characteristics and stability of the metal-oxide-semiconductor thin film transistor 300 are not affected. The problem that different types of thin film transistors cannot be stably operated for a long time in the same display panel in the prior art can be relieved.

In the embodiment shown in FIG. 1, the array substrate 10 provided by the present disclosure includes a first insulating layer 500 located between the active layer 201 and a gate electrode 202 of the low temperature poly-silicon thin film transistor 200. The first insulating layer 500 includes a first silicon oxide layer M103 and a first silicon nitride layer M104 which are stacked and disposed. The first silicon nitride layer M104 is patterned to form a first hydrogen ion film of the hydrogen ion film 400.

In the embodiment shown in FIG. 1, the array substrate 10 provided by the present disclosure includes a second insulating layer 600 located between the gate electrode 202 and the source/drain electrode 203 of the low temperature poly-silicon thin film transistor 200. The second insulating layer 600 includes a second silicon oxide layer M108 and a second silicon nitride layer M109. The second silicon nitride layer M109 is patterned to form a second hydrogen ion film of the hydrogen ion film 400.

In the array substrate 10 provided by the embodiment of the present disclosure shown in FIG. 1, the second silicon oxide layer M108 is disposed between a gate electrode 301 and an active layer 302 of the metal-oxide-semiconductor thin film transistor 300.

In the embodiment shown in FIG. 1, the array substrate 10 provided by the present disclosure includes a buffer layer M101 formed on the substrate M100 and a third insulating layer M106 located between the gate electrode 202 of the low temperature poly-silicon thin film transistor 200 and the second insulating layer 600. The first silicon oxide layer M103 and the third insulating layer M106 are stacked and disposed between the buffer layer M101 and the gate electrode 301 of the metal-oxide-semiconductor thin film transistor 300.

In one embodiment, a material of the third insulating layer M106 is silicon oxide, so as to reduce material complexity.

In the array substrate 10 provided by the embodiment of the present disclosure shown in FIG. 1, the active layer 201 of the low temperature poly-silicon thin film transistor 200 is disposed on the buffer layer M101.

In one embodiment, a material of the buffer layer M101 in the array substrate 10 provided by the present disclosure is silicon oxide, so as to reduce material complexity.

In the embodiment shown in FIG. 1, the array substrate 10 provided by the present disclosure further includes a storage capacitor 700.

A first electrode plate 701 of the storage capacitor 700 and the gate electrode 202 of the low temperature poly-silicon thin film transistor 200 are disposed in the same layer, and a second electrode plate 702 of the storage capacitor 700 and the gate electrode 301 of the metal-oxide-semiconductor thin film transistor 300 are disposed in the same layer.

In the embodiment shown in FIG. 1, the array substrate 10 provided by the present disclosure further includes a protection layer M112. The first silicon oxide layer M103 and the first silicon nitride layer M104 are disposed between the buffer layer M101 and the first electrode plate 701 of the storage capacitor 700. The third insulating layer M106 is disposed between the first electrode plate 701 and the second electrode plate 702 of the storage capacitor 700. The second silicon oxide layer M108 and the second silicon nitride layer M109 are disposed between the second electrode plate 702 of the storage capacitor 700 and the protection layer M112.

In one embodiment, a material of the protection layer M112 in the array substrate 10 provided by the present disclosure is silicon oxide, so as to reduce material complexity.

In one embodiment, a poly-silicon layer M102 is patterned to form the active layer 201 of the low temperature poly-silicon thin film transistor 200.

In one embodiment, a first metal layer M105 is patterned to form the gate electrode 201 of the low temperature poly-silicon thin film transistor 200 and the first electrode plate 701 of the storage capacitor 700.

In one embodiment, a second metal layer M107 is patterned to form the second electrode plate 702 of the storage capacitor 700 and the gate electrode 301 of the metal-oxide-semiconductor thin film transistor 300.

In one embodiment, a material of the first metal layer M105 and the second metal layer M107 is cupper, titanium-aluminium-titanium alloy and so on.

In one embodiment, a metal oxide layer M110 is patterned to form the active layer 302 of the metal-oxide-semiconductor thin film transistor 300.

In one embodiment, a source/drain electrode metal layer M111 is patterned to form the source/drain electrode 203 of the low temperature poly-silicon thin film transistor 200 and a source/drain electrode 303 of the metal-oxide-semiconductor thin film transistor 300.

In one embodiment, the present disclosure further provides a display device. The display device includes a display panel. An array substrate of the display panel includes:

A substrate;

A low temperature poly-silicon (LTPS) thin film transistor (TFT) and a metal-oxide-semiconductor (MOS) thin film transistor formed on the substrate; and A hydrogen ion film formed between an active layer and a source/drain electrode of the low temperature poly-silicon thin film transistor, wherein a hole is formed in a region of the hydrogen ion film where the metal-oxide-semiconductor thin film transistor is disposed.

In the display device provided by the embodiment of the present disclosure, the array substrate includes a first insulating layer located between the active layer and a gate electrode of the low temperature poly-silicon thin film transistor. The first insulating layer includes a first silicon oxide layer and a first silicon nitride layer. The first silicon nitride layer is patterned to form a first hydrogen ion film of the hydrogen ion film.

In the display device provided by the embodiment of the present disclosure, the array substrate 10 includes a second insulating layer located between the gate electrode and the source/drain electrode of the low temperature poly-silicon thin film transistor. The second insulating layer includes a second silicon oxide layer and a second silicon nitride layer. The second silicon nitride layer is patterned to form a second hydrogen ion film of the hydrogen ion film.

In the display device provided by the embodiment of the present disclosure, the second silicon oxide layer is disposed between a gate electrode and an active layer of the metal-oxide-semiconductor thin film transistor.

In the display device provided by the embodiment of the present disclosure, the array substrate includes a buffer layer formed on the substrate and a third insulating layer located between the gate electrode of the low temperature poly-silicon thin film transistor and the second insulating layer. The first silicon oxide layer and the third insulating layer are stacked and disposed between the buffer layer and the gate electrode of the metal-oxide-semiconductor thin film transistor.

In the display device provided by the embodiment of the present disclosure, the active layer of the low temperature poly-silicon thin film transistor is disposed on the buffer layer.

In the display device provided by the embodiment of the present disclosure, a material of the buffer layer is silicon oxide.

In the display device provided by the embodiment of the present disclosure, the array substrate further includes a storage capacitor.

A first electrode plate of the storage capacitor and the gate electrode of the low temperature poly-silicon thin film transistor are disposed in the same layer, and a second electrode plate of the storage capacitor and the gate electrode of the metal-oxide-semiconductor thin film transistor are disposed in the same layer.

In the display device provided by the embodiment of the present disclosure, the array substrate further includes a protection layer. The first silicon oxide layer and the first silicon nitride layer are disposed between the buffer layer and the first electrode plate of the storage capacitor. The third insulating layer is disposed between the first electrode plate and the second electrode plate of the storage capacitor. The second silicon oxide layer and the second silicon nitride layer are disposed between the second electrode plate of the storage capacitor and the protection layer.

In the display device provided by the embodiment of the present disclosure, the display panel is a liquid crystal display panel or an organic light emitting diode (OLED) display panel.

In order to manufacturing the array substrate in the above-mentioned embodiment, an embodiment of the present disclosure further provides a manufacturing method of the array substrate. The manufacturing method of the array substrate includes the following steps.

In step one, a substrate, for example, a glass plate or a transparent flexible substrate, is provided.

In step two, thin film transistors and a hydrogen ion film are manufactured. The thin film transistors include a low temperature poly-silicon thin film transistor and a metal-oxide-semiconductor thin film transistor formed on the substrate. The hydrogen ion film is formed between an active layer and a source/drain electrode of the low temperature poly-silicon thin film transistor, and a hole is formed in a region of the hydrogen ion film where the metal-oxide-semiconductor thin film transistor is disposed.

The embodiment of the present disclosure provides the manufacturing method of the array substrate. The array substrate includes the low temperature poly-silicon thin film transistor and the metal-oxide-semiconductor thin film transistor formed on the substrate and the hydrogen ion film. The hydrogen ion film is formed between the active layer and the source/drain electrode of the low temperature poly-silicon thin film transistor, and the hole is formed in the region of the hydrogen ion film where the metal-oxide-semiconductor thin film transistor is disposed. Hydrogen elements generated based on the hydrogen ion film are bonded with silicon atoms, thereby repairing the above-mentioned defects inside the poly-silicon thin film and improving the electrical performance and stability of the low temperature poly-silicon thin film transistor. Furthermore, the hydrogen elements are not diffused to the region where the metal-oxide-semiconductor thin film transistor is disposed. The oxygen vacancies are not generated from the metal oxides of the metal-oxide-semiconductor thin film transistor, and the electrical characteristics and stability of the metal-oxide-semiconductor thin film transistor are not affected. The problem that different types of thin film transistors cannot be stably operated for a long time in the same display panel in the prior art can be relieved.

The manufacturing method of the array substrate provided by the embodiment of the present disclosure includes the following steps.

In step A, a silicon oxide film is deposited on the substrate M100 to serve as the buffer layer M101. An amorphous silicon thin film is deposited on the buffer layer M101. Hydrogen elements in the amorphous silicon thin film are removed by a high temperature, and a surface of the amorphous silicon thin film is cleaned after a cleaning process. The amorphous silicon thin film is crystallized as the poly-silicon layer M102 by laser light. A poly-silicon island 201 is manufacturing by a photolithography process and an etching process. After a photoresist layer is formed, threshold voltages of the thin film transistors are adjusted by an ion injection process. A channel region, a source electrode region, and a drain electrode region are defined by a photolithography process. A heavily-doped source electrode region and drain electrode region are defined by an ion injection process. A photoresist is removed.

Figure 2:
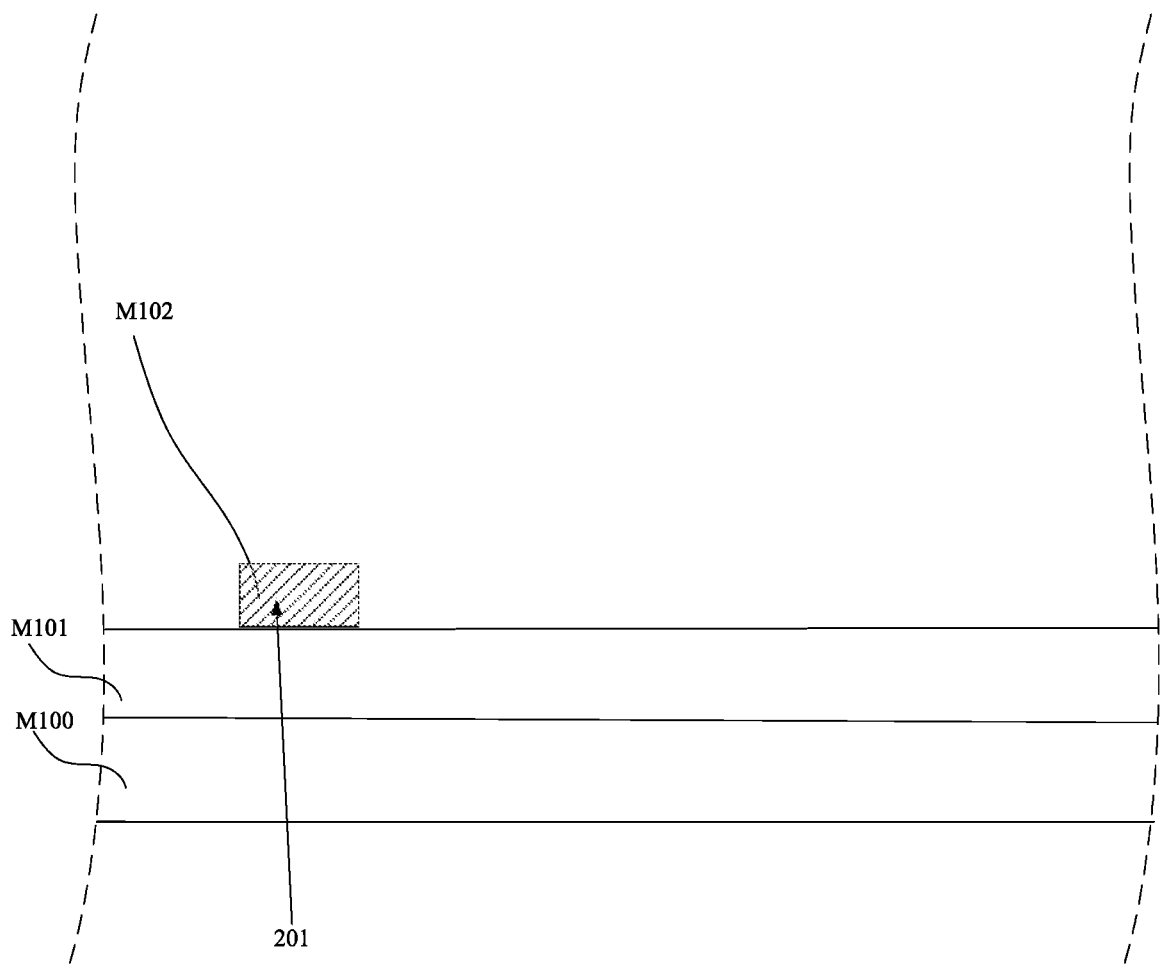
FIGS. 2-10 illustrate a process of a manufacturing method of the array substrate provided by an embodiment of the present disclosure.

A structure shown in FIG. 2 is obtained after step A is performed.

In step B, a gate insulating layer (i.e., the above-mentioned first insulating layer 500) is deposited on the poly-silicon island 201. The gate insulating layer sequentially includes two thin films including the first silicon oxide layer M103 and the first silicon nitride layer M104 from bottom to top.

Figure 3:
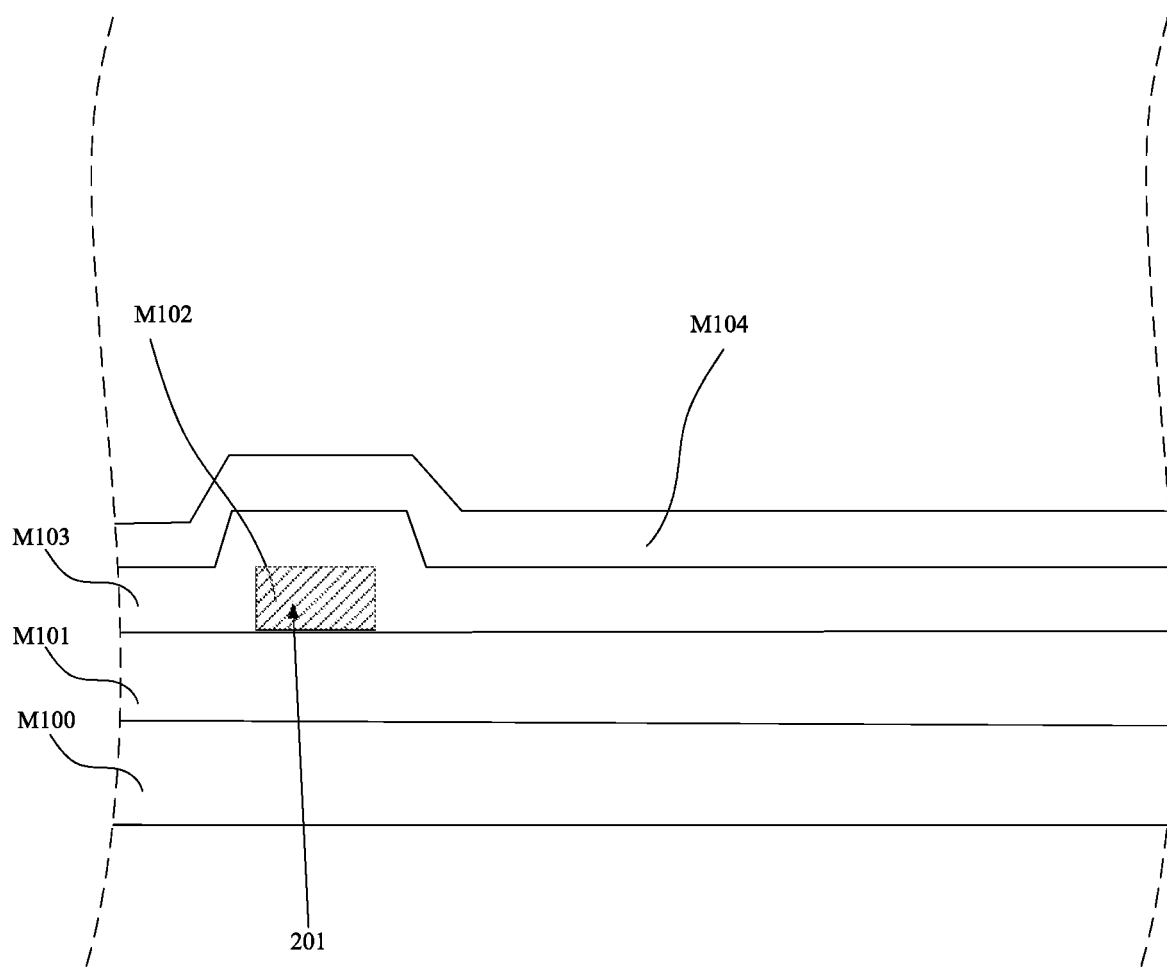

A structure shown in FIG. 3 is obtained after step B is performed.

In step C, the first metal layer M105 is deposited on the gate insulating layer, and required patterns of the first metal layer including the gate electrode 202 and the first electrode plate 701 are defined by a photolithography/etching process. When the first metal layer is etched, process parameters in the dry etching process are adjusted. The first silicon nitride layer M104 not under the patterns of the first metal layer is removed, and the photoresist is removed.

Figure 4:
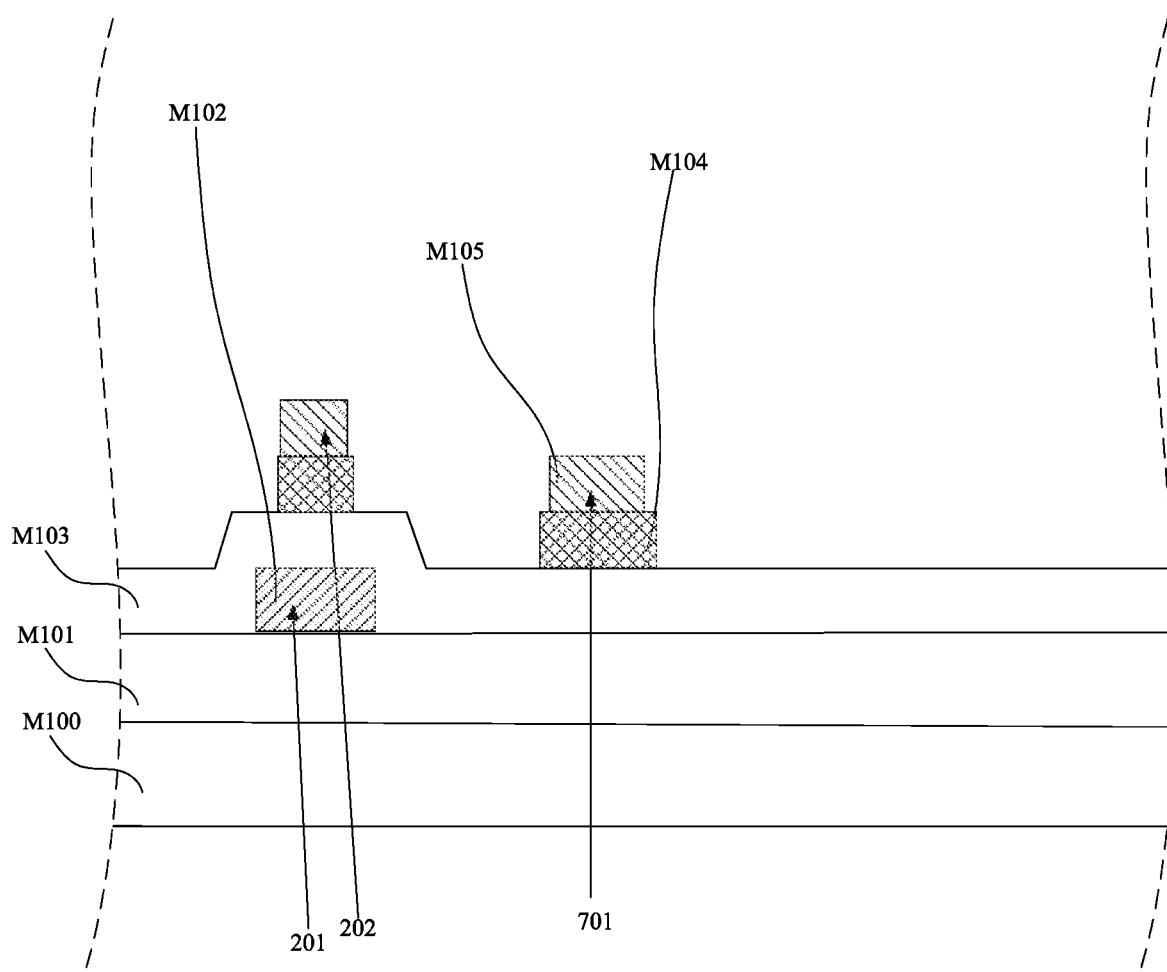

A structure shown in FIG. 4 is obtained after step C is performed.

In step D, a silicon oxide layer is deposited on the manufactured patterns of the first metal layer to serve as a dielectric layer (i.e., the above-mentioned third insulating layer M106) of the storage capacitor 700 between the two electrode plates.

Figure 5:
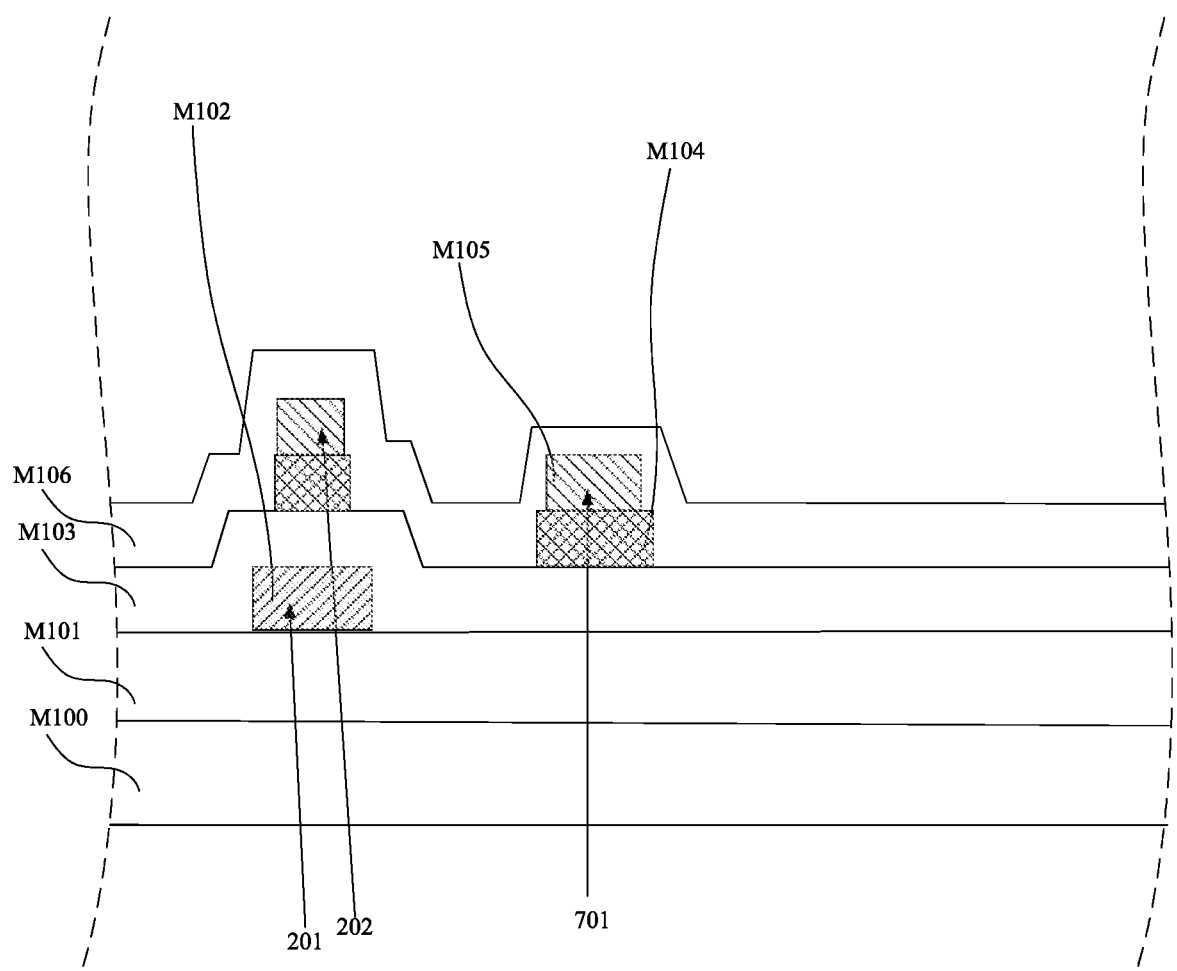

A structure shown in FIG. 5 is obtained after step D is performed.

In step E, the second metal layer M107 is deposited on the dielectric layer, and patterns of the second metal layer including the second electrode plate 702 and the gate electrode 301 are defined by a photolithography/etching process. A photoresist is removed.

Figure 6:
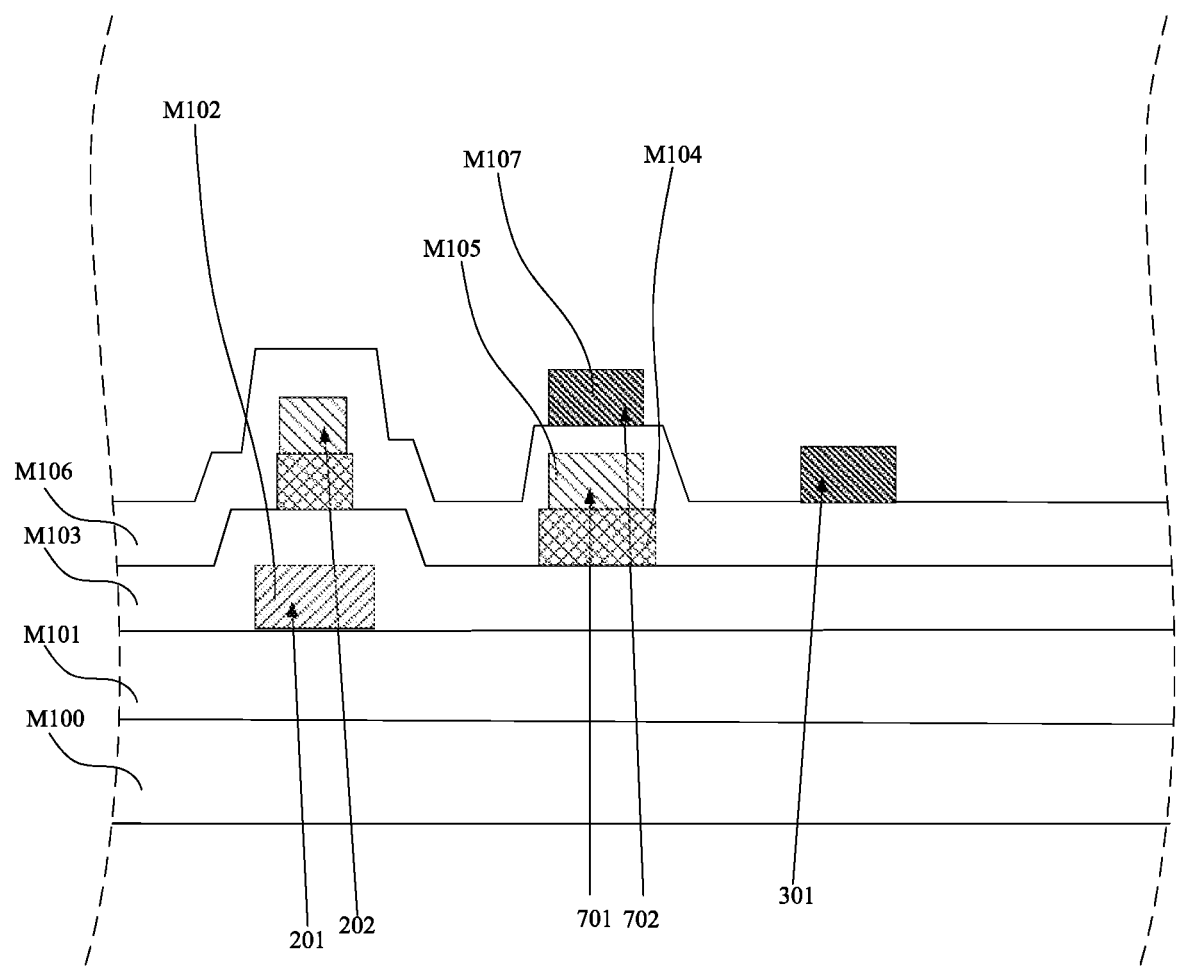

A structure shown in FIG. 6 is obtained after step E is performed.

In step F, two dielectric layers (i.e., the above-mentioned second insulating layer 600) including the second silicon oxide layer M108 and the second silicon nitride layer M109 are sequentially deposited on the patterns of the second metal layer. The dielectric layers are located between the gate electrode 202 and the source/drain electrode metal layer M111.

Figure 7:
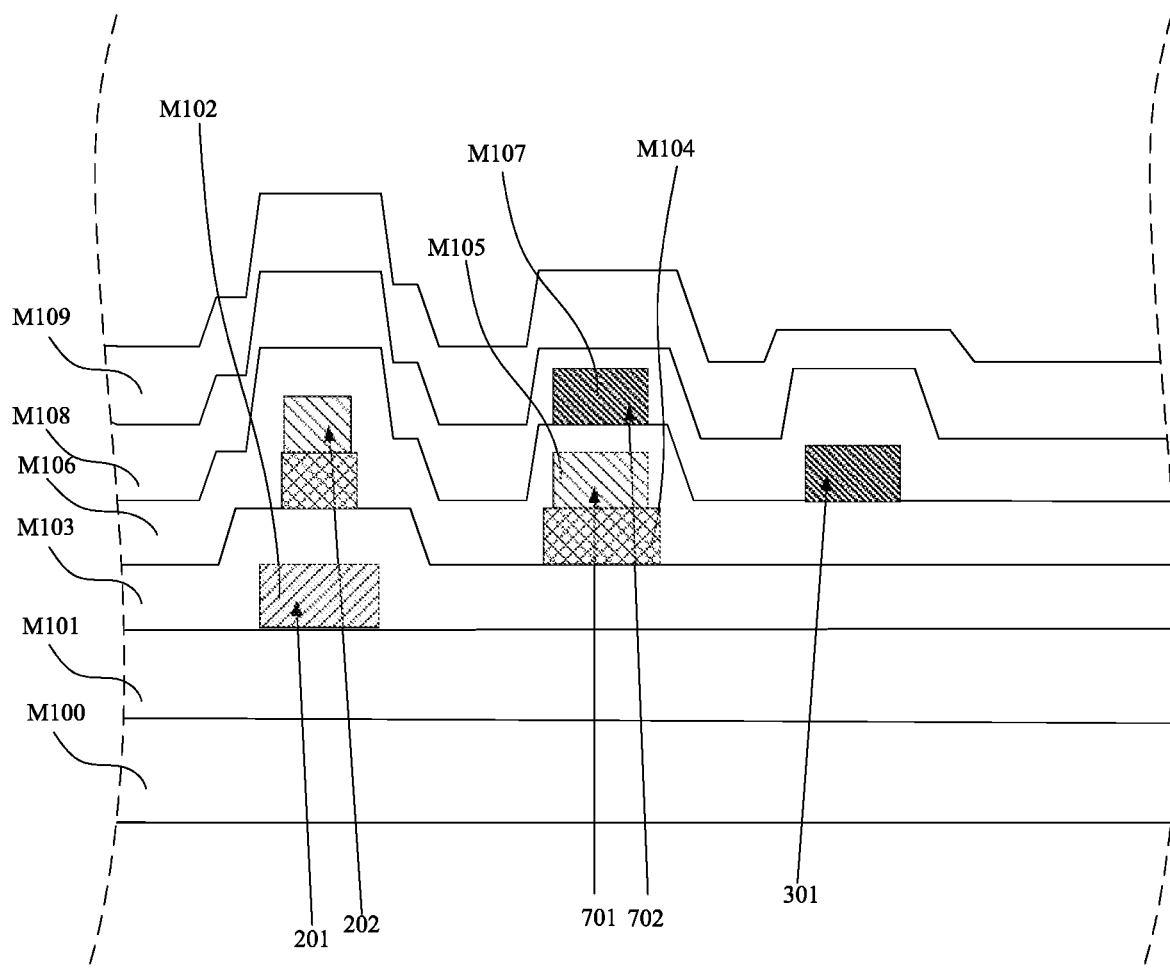

A structure shown in FIG. 7 is obtained after step F is performed.

Figure 8:
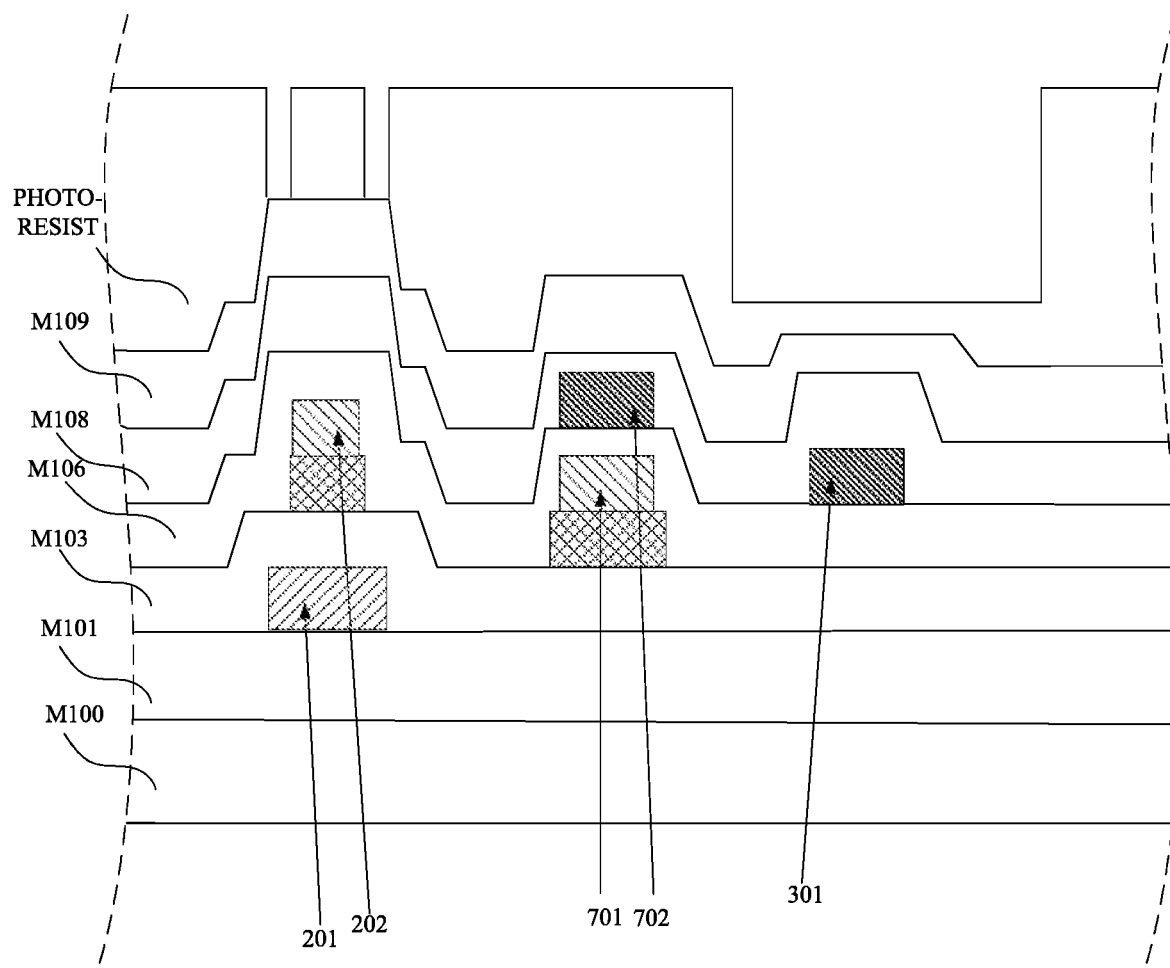

In step G, patterns of a photoresist in FIG. 8 are manufactured by a gray mask. A first part includes the photoresist is in vias connected to the polysilicon. The photoresist in the vias is exposed and developed. A second part includes the photoresist on the gate electrode 301. The second part corresponds to a region of the gray mask, and the photoresist having a part thickness is removed.

A structure shown in FIG. 8 is obtained after step G is performed.

In step H, a dry etching is performed on the array substrate including the photoresist in FIG. 8. The vias of the active layer 201 are etched, and the second silicon nitride layer M109 on the metal-oxide-semiconductor thin film transistor is removed. The photoresist is removed.

Figure 9:
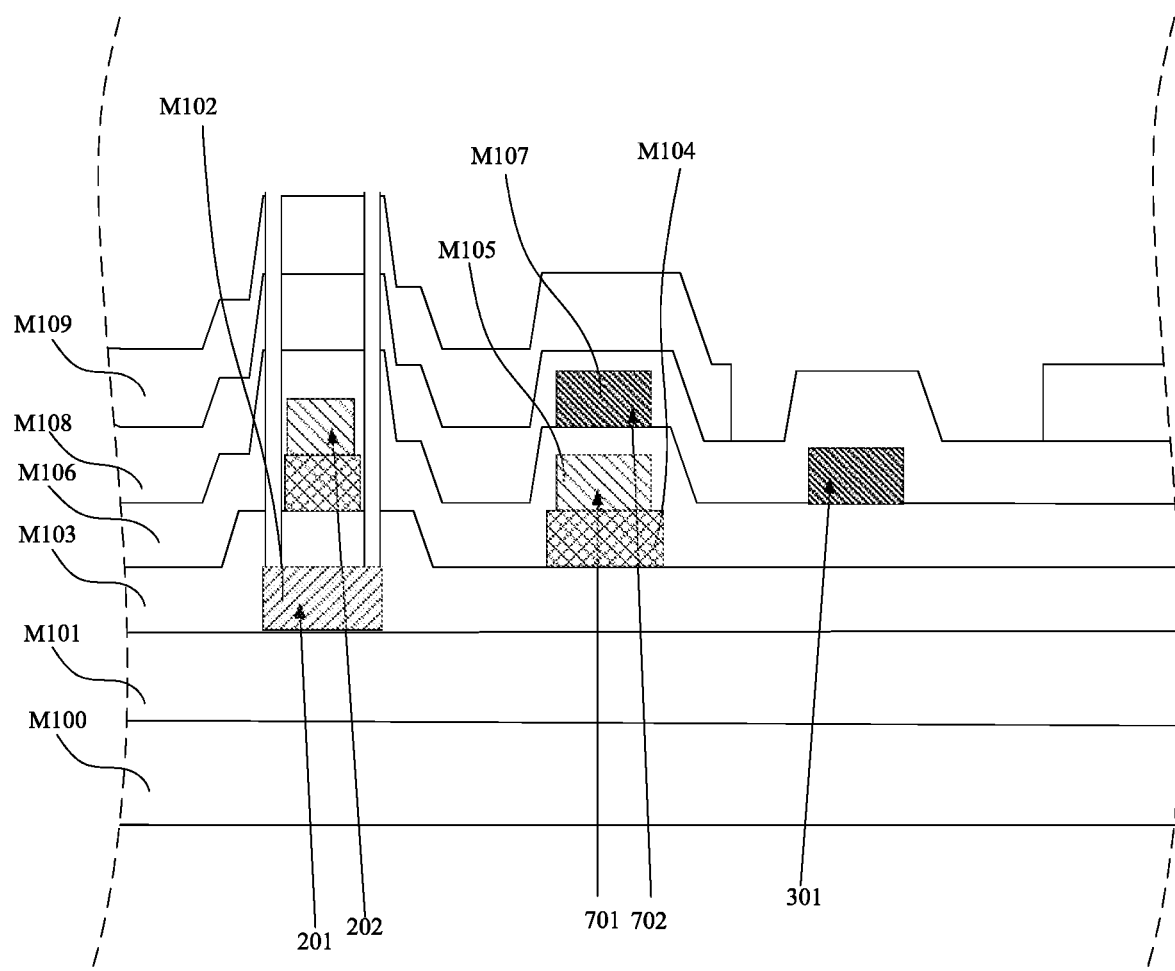

A structure shown in FIG. 9 is obtained after step H is performed.

In step I, the metal oxide layer (e.g., IGZO) M110 is deposited on the structure in FIG. 9. A pattern of an active layer of the metal oxide layer M110 is defined by a photolithography/etching process. After a photoresist is removed, the metal oxide layer (e.g., IGZO) M110 is deposited on the pattern. Patterns of the source/drain electrodes (including the source/drain electrode 203 and the source/drain electrode 303) are defined by a photolithography/etching process. A silicon oxide layer is deposited on the patterns of the source/drain electrodes to serve as the protection layer M112 after a photoresist layer is removed.

Figure 10:
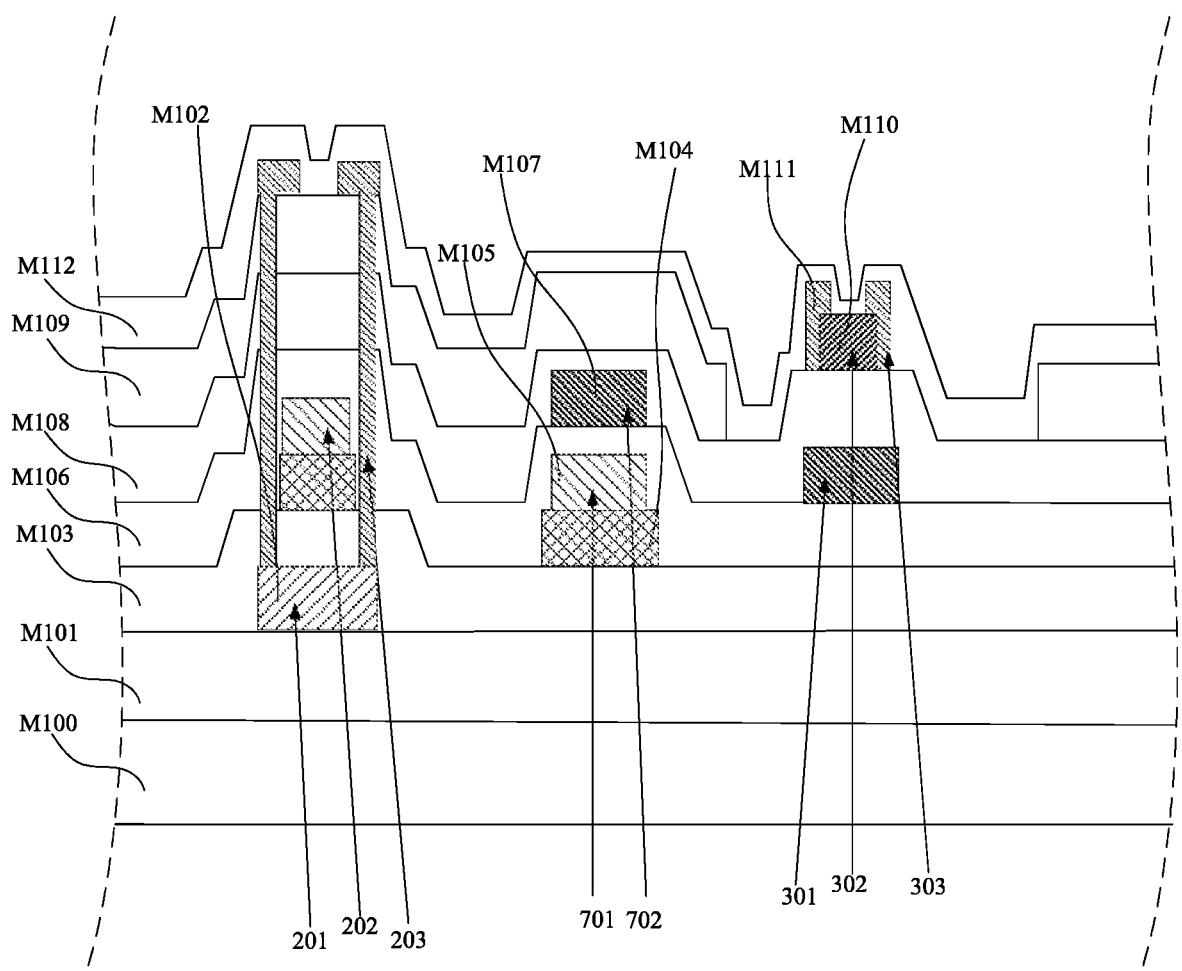

A structure shown in FIG. 10 is obtained after step I is performed.

As such, the structure of the thin film transistor device is completed. A structure according to the requirement of an OLED display device or an LCD display device can be manufactured on the structure of the thin film transistor device in the following process and is not repeated herein.

It can be appreciated from the above-mentioned embodiments that the present disclosure provides the array substrate, the manufacturing method of the array substrate, and the display device. The array substrate includes the low temperature poly-silicon thin film transistor and the metal-oxide-semiconductor thin film transistor formed on the substrate and the hydrogen ion film. The hydrogen ion film is formed between the active layer and the source/drain electrode of the low temperature poly-silicon thin film transistor, and the hole is formed in the region of the hydrogen ion film where the metal-oxide-semiconductor thin film transistor is disposed. Hydrogen elements generated based on the hydrogen ion film are bonded with silicon atoms, thereby repairing the above-mentioned defects inside the poly-silicon thin film and improving the electrical performance and stability of the low temperature poly-silicon thin film transistor. Furthermore, the hydrogen elements are not diffused to the region where the metal-oxide-semiconductor thin film transistor is disposed. The oxygen vacancies are not generated from the metal oxides of the metal-oxide-semiconductor thin film transistor, and the electrical characteristics and stability of the metal-oxide-semiconductor thin film transistor are not affected. The problem that different types of thin film transistors cannot be stably operated for a long time in the same display panel in the prior art can be relieved.

In summary, although the present disclosure has been provided in the preferred embodiments described above, the foregoing preferred embodiments are not intended to limit the present disclosure. Those skilled in the art, without departing from the spirit and scope of the present disclosure, may make modifications and variations, so the scope of the protection of the present disclosure is defined by the claims.

What is claimed is:

1. An array substrate, comprising:
a substrate;
a low temperature poly-silicon thin film transistor and a metal-oxide-semiconductor thin film transistor formed on the substrate; and
a hydrogen ion film formed between an active layer and a source/drain electrode of the low temperature poly-silicon thin film transistor, wherein a hole is formed in a region of the hydrogen ion film where the metal-oxide-semiconductor thin film transistor is disposed;
wherein the array substrate comprises a first insulating layer located between the active layer and a gate electrode of the low temperature poly-silicon thin film transistor, the first insulating layer comprises a first silicon oxide layer and a first silicon nitride layer, and the first silicon nitride layer is patterned to form a first hydrogen ion film of the hydrogen ion film; and
wherein the array substrate comprises a second insulating layer located between the gate electrode and the source/drain electrode of the low temperature poly-silicon thin film transistor, the second insulating layer comprises a second silicon oxide layer and a second silicon nitride layer, and the second silicon nitride layer is patterned to form a second hydrogen ion film of the hydrogen ion film.

2. The array substrate of claim 1, wherein the second silicon oxide layer is disposed between a gate electrode and an active layer of the metal-oxide-semiconductor thin film transistor.

3. The array substrate of claim 1, wherein the array substrate comprises a buffer layer formed on the substrate and a third insulating layer located between the gate electrode of the low temperature poly-silicon thin film transistor and the second insulating layer; and the first silicon oxide layer and the third insulating layer are stacked and disposed between the buffer layer and the gate electrode of the metal-oxide-semiconductor thin film transistor.

4. The array substrate of claim 3, wherein the active layer of the low temperature poly-silicon thin film transistor is disposed on the buffer layer.

5. The array substrate of claim 3, wherein a material of the buffer layer is silicon oxide.

6. The array substrate of claim 3, wherein the array substrate further comprises a storage capacitor; and
a first electrode plate of the storage capacitor and the gate electrode of the low temperature poly-silicon thin film transistor are disposed in the same layer, and a second electrode plate of the storage capacitor and the gate electrode of the metal-oxide-semiconductor thin film transistor are disposed in the same layer.

7. The array substrate of claim 6, wherein the array substrate further comprises a protection layer; and
the first silicon oxide layer and the first silicon nitride layer are disposed between the buffer layer and the first electrode plate of the storage capacitor, the third insulating layer is disposed between the first electrode plate and the second electrode plate of the storage capacitor, and the second silicon oxide layer and the second silicon nitride layer are disposed between the second electrode plate of the storage capacitor and the protection layer.

8. A manufacturing method of an array substrate, comprising:
providing a substrate; and
manufacturing thin film transistors and a hydrogen ion film;
wherein the thin film transistors comprise a low temperature poly-silicon thin film transistor and a metal-oxide-semiconductor thin film transistor formed on the substrate, the hydrogen ion film is formed between an active layer and a source/drain electrode of the low temperature poly-silicon thin film transistor, and a hole is formed in a region of the hydrogen ion film where the metal-oxide-semiconductor thin film transistor is disposed;
wherein the array substrate comprises a first insulating layer located between the active layer and a gate electrode of the low temperature poly-silicon thin film transistor, the first insulating layer comprises a first silicon oxide layer and a first silicon nitride layer, and the first silicon nitride layer is patterned to form a first hydrogen ion film of the hydrogen ion film; and
wherein the array substrate comprises a second insulating layer located between the gate electrode and the source/drain electrode of the low temperature poly-silicon thin film transistor, the second insulating layer comprises a second silicon oxide layer and a second silicon nitride layer, and the second silicon nitride layer is patterned to form a second hydrogen ion film of the hydrogen ion film.

9. A display device, comprising a display panel, an array substrate of the display panel comprising:
a substrate;
a low temperature poly-silicon thin film transistor and a metal-oxide-semiconductor thin film transistor formed on the substrate; and
a hydrogen ion film formed between an active layer and a source/drain electrode of the low temperature poly-silicon thin film transistor, wherein a hole is formed in a region of the hydrogen ion film where the metal-oxide-semiconductor thin film transistor is disposed;
wherein the array substrate comprises a first insulating layer located between the active layer and a gate electrode of the low temperature poly-silicon thin film transistor, the first insulating layer comprises a first silicon oxide layer and a first silicon nitride layer, and the first silicon nitride layer is patterned to form a first hydrogen ion film of the hydrogen ion film; and
wherein the array substrate comprises a second insulating layer located between the gate electrode and the source/drain electrode of the low temperature poly-silicon thin film transistor, the second insulating layer comprises a second silicon oxide layer and a second silicon nitride layer, and the second silicon nitride layer is patterned to form a second hydrogen ion film of the hydrogen ion film.

10. The display device of claim 9, wherein the display panel is a liquid crystal display panel or an organic light emitting diode display panel.

11. The display device of claim 9, wherein the second silicon oxide layer is disposed between a gate electrode and an active layer of the metal-oxide-semiconductor thin film transistor.

12. The display device of claim 9, wherein the array substrate comprises a buffer layer formed on the substrate and a third insulating layer located between the gate electrode of the low temperature poly-silicon thin film transistor and the second insulating layer; and
the first silicon oxide layer and the third insulating layer are stacked and disposed between the buffer layer and the gate electrode of the metal-oxide-semiconductor thin film transistor.

13. The display device of claim 12, wherein the active layer of the low temperature poly-silicon thin film transistor is disposed on the buffer layer.

14. The display device of claim 12, wherein a material of the buffer layer is silicon oxide.

15. The display device of claim 12, wherein the array substrate further comprises a storage capacitor; and
a first electrode plate of the storage capacitor and the gate electrode of the low temperature poly-silicon thin film transistor are disposed in the same layer, and a second electrode plate of the storage capacitor and the gate electrode of the metal-oxide-semiconductor thin film transistor are disposed in the same layer.

16. The display device of claim 15, wherein the array substrate further comprises a protection layer; and
the first silicon oxide layer and the first silicon nitride layer are disposed between the buffer layer and the first electrode plate of the storage capacitor, the third insulating layer is disposed between the first electrode plate and the second electrode plate of the storage capacitor, and the second silicon oxide layer and the second silicon nitride layer are disposed between the second electrode plate of the storage capacitor and the protection layer.

* * * * *